US 6,900,067 B2

(12) United States Patent
Kobayashi et al.

(10) Patent No.: US 6,900,067 B2
(45) Date of Patent: May 31, 2005

(54) GROWTH OF III-NITRIDE FILMS ON MISMATCHED SUBSTRATES WITHOUT CONVENTIONAL LOW TEMPERATURE NUCLEATION LAYERS

(75) Inventors: Junko Kobayashi, Sunnyvale, CA (US); Werner K. Goetz, Palo Alto, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 306 days.

(21) Appl. No.: 10/317,309

(22) Filed: Dec. 11, 2002

(65) Prior Publication Data

US 2004/0115853 A1 Jun. 17, 2004

(51) Int. Cl.$^7$ ............................................. H01L 21/20
(52) U.S. Cl. ........................ 438/22; 438/479; 438/483
(58) Field of Search ..................... 438/22–47, 479–509

(56) References Cited

U.S. PATENT DOCUMENTS

| | | | |
|---|---|---|---|
| 5,393,993 A | 2/1995 | Edmond et al. | 257/77 |
| 5,585,648 A | 12/1996 | Tischler | 257/77 |
| 5,661,074 A | 8/1997 | Tischler | 438/32 |
| 5,888,886 A * | 3/1999 | Sverdlov et al. | 438/505 |
| 5,903,017 A | 5/1999 | Itaya et al. | 257/190 |
| 5,990,495 A | 11/1999 | Ohba | 257/94 |
| 5,990,496 A | 11/1999 | Kunisato et al. | 257/94 |
| 6,106,898 A * | 8/2000 | Takamatsu et al. | 427/255.21 |
| 6,229,151 B1 | 5/2001 | Takeuchi et al. | 257/14 |
| 6,303,473 B1 | 10/2001 | Heffernan et al. | 438/483 |
| 6,426,512 B1 * | 7/2002 | Ito et al. | 257/12 |
| 6,440,214 B1 * | 8/2002 | Hooper et al. | 117/94 |
| 6,440,823 B1 * | 8/2002 | Vaudo et al. | 438/478 |
| 6,593,016 B1 | 7/2003 | Chiyo et al. | 428/698 |
| 6,610,551 B1 * | 8/2003 | Doverspike et al. | 438/22 |
| 6,683,327 B2 * | 1/2004 | Krames et al. | 257/98 |
| 2003/0102482 A1 * | 6/2003 | Saxler | 257/85 |
| 2003/0198837 A1 * | 10/2003 | Craven et al. | 428/698 |
| 2003/0207518 A1 * | 11/2003 | Kong et al. | 438/200 |
| 2004/0113163 A1 * | 6/2004 | Steigerwald et al. | 257/88 |

FOREIGN PATENT DOCUMENTS

| | | |
|---|---|---|
| JP | 10-27947 | 1/1989 |
| JP | 11-40893 | 6/1989 |
| JP | 11-97803 | 8/1989 |
| JP | 10-270368 | 10/1998 |
| JP | 11-112029 | of 1999 |
| JP | P2000-40858 A | 2/2000 |
| JP | P2000-68498 A | 3/2000 |
| JP | P2000-196143 A | 7/2000 |
| WO | WO 99/10936 | 3/1999 |

OTHER PUBLICATIONS

B. L. Liu et al., "MOCVD Growth of Device–Quality GaN on Sapphire using a Three–Step Approach", Journal of Crystal Growth 234 (2002), pp. 637–645.

(Continued)

*Primary Examiner*—Savitri Mulpuri
(74) *Attorney, Agent, or Firm*—Patent Law Group LLP; Rachel V. Leiterman

(57) ABSTRACT

A method of forming a light emitting device includes providing a sapphire substrate, growing an $Al_{1-x}Ga_xN$ first layer by vapor deposition on the substrate at a temperature between about 1000° C. and about 1180° C., and growing a III-nitride second layer overlying the first layer. The first layer may have a thickness between about 500 angstroms and about 5000 angstroms. In some embodiments, reaction between the group V precursor and the substrate is reduced by starting with a low molar ratio of group V precursor to group III precursor, then increasing the ratio during growth of the first layer, or by using nitrogen as an ambient gas.

23 Claims, 4 Drawing Sheets

OTHER PUBLICATIONS

T. Egawa et al., "Demonstration of an InGaN–Based Light–Emitting Diode on an AlN/Sapphire Template by Metalorganic Chemical Vapor Deposition", Applied Physics Letters, vol. 81, No. 2, Jul. 8, 2002, pp. 292–294.

Yasuo Ohba et al., "Mechanism for Reducing DislocationS at the Initial Stage of GaN Growth on Sapphire Substrates Using High–Temperature–Grown Single–Crystal AlN Buffer Layers", The Japan Society of Applied Physics, vol. 41, Part 2, No. 6A, Jun. 1, 2002, pp. L615–L618.

P. Kung et al., "High Quality AlN and GaN Epilayers Grown on (00.1) Sapphire, (100), and (111) Silicon Substrates", Applied Physics Letter, vol. 66, No. 22, May 29, 1995, pp. 2958–2960.

Tomohiko Shibata et al., New Buffer Layer Technique Using Underlying Epitaxial AlN Films for High–Quality GaN Growth, Material Research Society, Symposium Proceedings, vol. 693, 2002, pp. 13.48.1–13.48.5.

A.D. Hanser et al., "SiC Substrates for Growth of GaN and Related Compounds", The Institution of Electrical Engineers, 1999, pp. 386–390.

Yuichiro Kuga et al., "Violet and Near–UV Light Emission from GaN/Al$_{0.08}$ Ga$_{0.92}$N Injection Diode Grown on (0001) 6H–SiC Substrate by Low–Pressure Metal–Organic Vapor Phase Epitaxy", Japanese Journal of Applied Physics, vol. 34, Part 1, No. 8A,. Aug. 1995, pp. 4085–4086.

K. Horino et al., "Initial Growth Stage of AlGaN Grown Directly on (0001) 6H–SiC by MOVPE", Materials Research Society, Symposium Proceedings, Dec. 2–6, 1996, vol. 449, pp. 73–78.

F. A. Ponce et al., "Microstructure of GaN Epitaxy on SiC Using AlN Buffer Layers", America Institute of Physics, Appl. Phys. Lett. 67 (3), Jul. 17, 1995, pp. 410–412

J. S. Smart et al., "Single Step Process for Epitaxial Lateral Overgrowth of GaN on SiC and Sapphire Substrates", American Institute of Physics, Appl. Phys. Lett. vol. 75, No. 24, Dec. 13, 1999, pp 3820–3822.

C.F. Lin et al., "Growth and Characterizations of GaN on SiC Substrates with Buffer Layers", American Institute of Physics, J. Appl. Phys. 82 (5), Sep. 1, 1997, pp 2378–2382.

L.B. Rowland et al., "Aluminum Nitride/Silicon Carbide Multilayer Heterostructure PRoduced by Plasma–Assisted, Gas–Source Molecular Beam Epitaxy", American Institute of Physics, Appl. Phys. Lett. 62 (25), Jun. 21, 1993, pp 3333–3335.

J.A. Smart et al., "AlGaN/GaN Heterostructures on Insulating AlGaN Nucleation Layers", American Institute of Physics, Appl. Phys. Lett. vol. 75, No. 3, Jul. 19, 1999, pp 388–390.

T. Warren Weeks, Jr., et al., "GaN Thin Films Deposited via Organometallic Vapor Phase Epitaxy on α(6H)–SiC(0001) Using High–Temperature Monocrystalline AlN Buffer Layers", American Institute of Physics, Appl. Phys. Lett. (67 (3), Jul. 17, 1995, pp 401–403.

Yasuo Ohba et al., "Growth of High–Quality AlN, GaN and AlGaN with Automatically Smooth Surfaces on Sapphire Substrates", Japanese Journal of Applied Physics, vol. 36 (1997) Part 2, No. 12A, Dec. 1, 1997, pp L1565–L1567.

S. Yoshida et al., "Improvements on the Electrical and Luminescent Properties of Reactive Molecular Beam Epitaxially Grown GaN Films by Using AlN–Coated Sapphire Substrates ", Appl. Phys. Lett., vol. 42, No. 5, Mar. 1, 1983, pp 427–429.

* cited by examiner

GROWTH OF III-NITRIDE FILMS ON MISMATCHED SUBSTRATES WITHOUT CONVENTIONAL LOW TEMPERATURE NUCLEATION LAYERS

BACKGROUND

1. Field of Invention

This invention relates generally to the growth of III-nitride films on mismatched substrates.

2. Description of Related Art

Semiconductor light-emitting devices (LEDs) are among the most efficient light sources currently available. Materials systems currently of interest in the manufacture of high-brightness LEDs capable of operation across the visible spectrum include Group III–V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, or III-nitride substrate by metal-organic chemical vapor deposition (MOCVD), molecular beam epitaxy (MBE), or other epitaxial techniques. The stack often includes one or more n-type layers doped with, for example, Si, formed over the substrate, a light emitting or active region formed over the n-type layer or layers, and one or more p-type layers doped with, for example, Mg, formed over the active region.

Since III-nitride substrates are generally not commercially available, III-nitride devices are often fabricated on substrates such as sapphire and SiC, which are referred to as "mismatched" because of differences in lattice constant and thermal expansion coefficients between these substrates and III-nitride layers. The differences in lattice constant and thermal expansion coefficient cause strain which makes the fabrication of thick, flat, defect-free III-nitride layers difficult.

In the case of sapphire substrates in particular, one method to alleviate the problems caused by the lattice constant and thermal expansion coefficient mismatch is to grow the III-nitride device layers on a nucleation layer grown over the substrate. The nucleation layer is usually a thin amorphous or polycrystalline AlN or GaN layer formed by low temperature growth. In theory, since the amorphous or polycrystalline nucleation layer alleviates some strain caused by the lattice constant and thermal expansion coefficient mismatch, the quality of a crystalline III-nitride layer grown over the nucleation layer should be improved over a III-nitride layer grown without a nucleation layer.

The use of low temperature nucleation layers is not ideal for several reasons. Before growth of the semiconductor layers, the substrate is heated to a high temperature for cleaning, then the temperature in the reactor is reduced to grow the low temperature nucleation layer. The temperature must then be raised again to grow the device layers. Such temperature cycling is time consuming and therefore increases the likelihood of the accumulation of contaminants on the wafer surface that can affect yield or device performance. In addition, the heating that takes place between growth of the low temperature nucleation layer and growth of the next layer causes recrystallization in the low temperature nucleation layer that is necessary for growth of high quality layers over the nucleation layer. Accordingly, the heating must be carefully controlled. Deviations from the desired heating pattern can cause poor device performance or poor yields. Further, the materials quality of layers grown over the low temperature nucleation layer and the performance of the resulting device is sensitive to the thickness of the nucleation layer and the growth temperature of the nucleation layer. The thickness and temperature regimes that yield acceptable device performance can be narrow, making it difficult to maintain the required thickness and temperature regimes across the wafer and resulting in poor yield. Finally, employing a low temperature nucleation layer results in a high density of threading dislocations in the device layers, on the order of $10^{10}$ $cm^{-2}$. Additional processing is required to reduce the density of the threading dislocations. Such additional processing increases the time and cost of fabrication and the risk of poor yield or poor device performance.

Another method to alleviate the problems caused by the lattice constant and thermal expansion coefficient mismatch is described by U.S. Pat. No. 5,990,495 to Ohba. Ohba teaches "growing a buffer layer directly on a monocrystal substrate at a first temperature . . . and growing an element-forming layer on said buffer layer at a second temperature which is lower than said first temperature . . . . The temperature for growing the buffer layer should preferably be higher than 1300° C." See column 3, lines 54–64. After growth, the nucleation layer is annealed. "The temperature for annealing the buffer layer is preferably in the range of 1350° C. to 1500° C., and the time period for annealing the buffer layer should preferably be in the range of 10 minutes to 60 minutes. If the annealing temperature is less than 1350° C., it would be difficult to alleviate strain completely." See column 6, line 64 to column 7, line 2. Ohba's method of fabricating a high temperature nucleation layer is undesirable because it requires high temperature growth and a growth pause in order to perform the anneal.

SUMMARY

In accordance with embodiments of the present invention, a method of forming a light emitting device includes providing a sapphire substrate, growing an $Al_{1-x}Ga_xN$ first layer by vapor deposition on the substrate at a temperature between about 1000° C. and about 1180° C., and growing a III-nitride second layer overlying the first layer. The first layer may have a thickness between about 500 angstroms and about 5000 angstroms. In some embodiments, reaction between the group V precursor and the substrate is reduced by starting with a low molar ratio of group V precursor to group III precursor, then increasing the ratio during growth of the first layer, or by using nitrogen as an ambient gas.

The use of a high temperature nucleation layer according to embodiments of the present invention is preferable to a low temperature nucleation layer because it may eliminate the temperature cycling, growth pause, and additional processing required for low temperature nucleation layers, and because it eliminates problems with uniformity due to the narrow thickness and temperature regimes required by low temperature nucleation layers.

DETAILED DESCRIPTION

Figure 1:
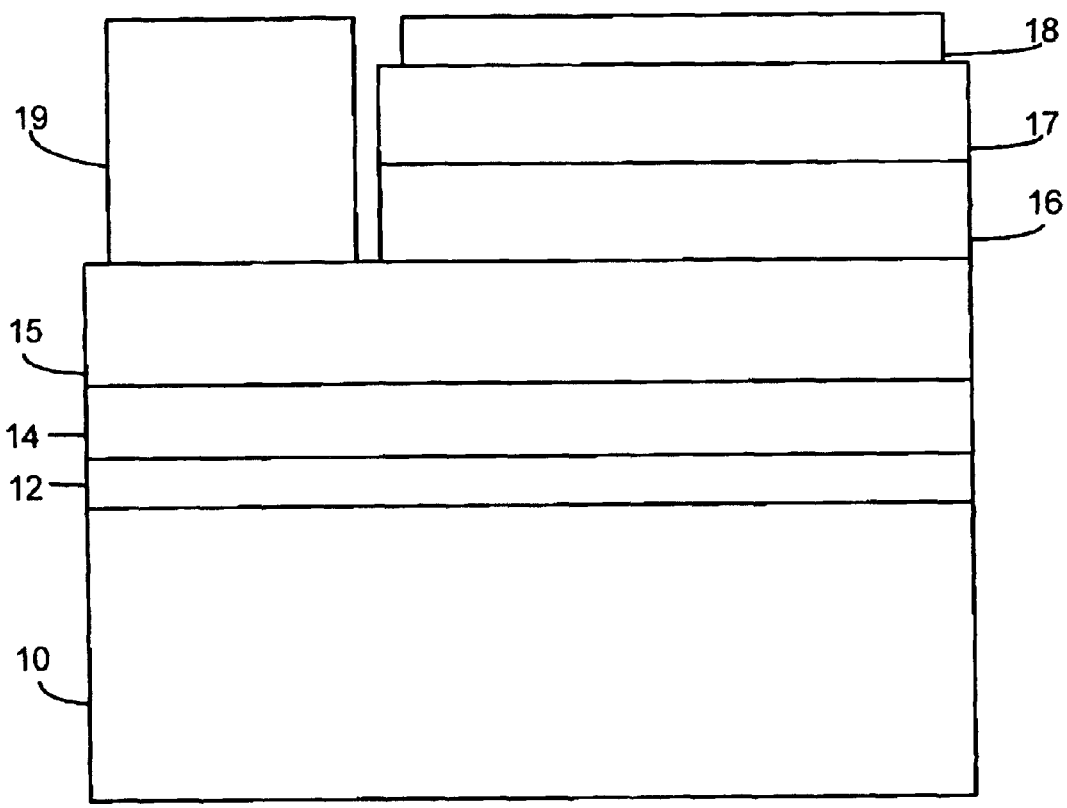
FIG. 1 illustrates a device fabricated according to embodiments of the present invention.

FIG. 1 illustrates a device according to an embodiment of the present invention. A high temperature nucleation layer 12 is formed over sapphire substrate 10. A coalescence layer 14 is then formed over nucleation layer 12, followed by an n-type region 15, an active region 16, and a p-type region 17. Each of n-type region 15, active region 16, and p-type region 17 may contain multiple layers of the same or different thickness, composition, and dopant concentration. In addition, n-type region 15 may contain one or more p-type layers, active region 16 may contain one or more n- or p-type layers, and p-type region 17 may contain one or more n-type layer. A portion of active region 16 and p-type region 17 are etched away to expose a portion of n-type region 15 on which n-contact 19 is formed. P-contact 18 is formed on p-type region 17. Contacts 18 and 19 may be reflective, such that light is extracted from the device through substrate 10, or transparent, such that light is extracted from the device through contacts 18 and 19.

Nucleation layer 12 is $Al_{1-x}Ga_xN$ with a thickness that can range between about 500 angstroms to 5000 angstroms, usually ranges between about 1000 angstroms and about 3000 angstroms, and most preferably ranges between about 2000 angstroms and about 2500 angstroms. The composition of aluminum nitride may be between about 50% and 100% (i.e. x ranges from 0 to about 0.5). Nucleation layer 12 may be fabricated at a temperature ranging from about 1000° C. to about 1180° C., is usually fabricated at a temperature ranging from about 1060° C. to about 1150° C., and is most preferably fabricated at a temperature ranging from about 1080° C. to 1100° C. In some embodiments, coalescence layers in devices with nucleation layers grown at less than 1060° C. exhibited increased surface roughness. The suitable temperature, composition, and thickness of nucleation layer 12 may depend on the layers grown over nucleation layer 12. Typically, nucleation layer 12 is undoped, but in some embodiments it may be lightly doped.

After growth of nucleation layer 12, a coalescence layer 14 is formed to provide a smooth surface for later growth of device layers 15, 16, and 17. Coalescence layer 14 is often GaN, but may be GaN, InGaN, AlGaN, AlN, or AlInGaN. The composition of coalescence layer 14 is selected such that coalescence layer 14 has a desired strain state and is transparent to light emitted by the active region. In some embodiments, coalescence layer 14 is an additional layer separate from the device layers that provides a smooth uniform surface on which to grow the device layers. In other embodiments, coalescence layer is the first device layer and serves a purpose in the device in addition to providing a smooth surface for the layers overlying coalescence layer 14. Coalescence layer 14 may be undoped or doped n-type or p-type. If the dopant is Si, coalescence layer may be doped to a maximum dopant concentration of about $5 \times 10^{18}$ $cm^{-3}$. Coalescence layer 14 may be more heavily doped with n-type dopants other than Si. If the dopant is a p-type dopant such as Mg, coalescence layer 14 may be doped to a maximum dopant concentration of about $5 \times 10^{19}$ $cm^{-3}$. The thickness of coalescence layer 14 may range from about 500 angstroms to about 2 microns, and usually ranges from about 0.5 microns to about 1.5 microns. Coalescence layer 14 is usually grown at the same temperature as nucleation layer 12, or at a slightly lower temperature. In one example, nucleation layer 12 is grown at a temperature of 1090° C., and coalescence layer 14 is grown at a temperature ranging from about 1060° C. to about 1090° C.

The semiconductor layers in the device illustrated in FIG. 1 are usually formed by a vapor deposition process such as chemical vapor deposition or vapor phase epitaxy. Vapor deposition according to embodiments of the present invention typically takes place at a pressure greater than 1 millitorr, often between about 50 millitorr and about 1 atm.

Figure 2:
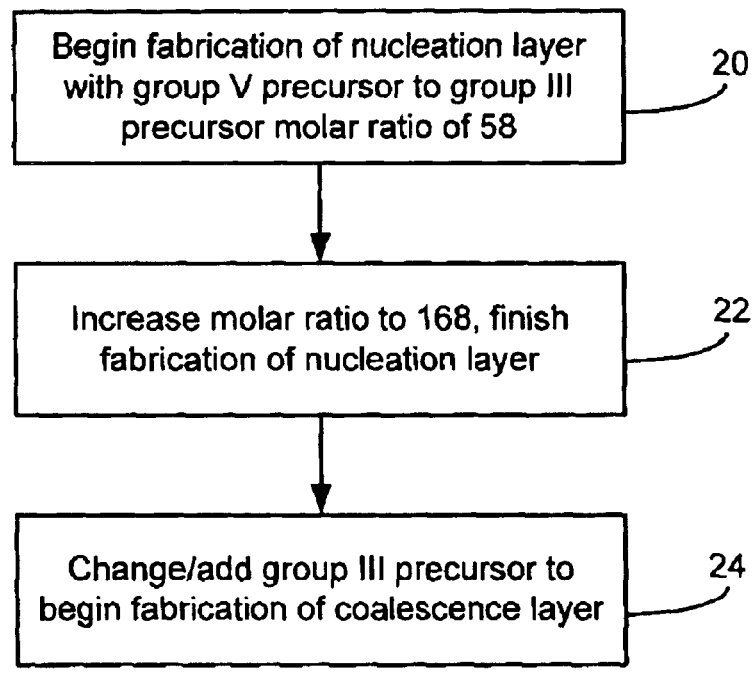
FIG. 2 illustrates a method of forming nucleation layer 12 and coalescence layer 14 of FIG. 1.

In some embodiments, the ratio of group V precursors to group III precursors is adjusted during fabrication of nucleation layer 12 in order to reduce reaction, for example nitridation, between the group V precursor and the substrate. FIG. 2 illustrates one such example of a method of forming nucleation layer 12 and coalescence layer 14. Growth of the nucleation layer begins in stage 20. In some embodiments, in order to reduce the likelihood of reaction between the group V precursor and the substrate due to exposure of the substrate to the group V precursor before growth begins, the group V precursor and group III precursor are introduced into the reactor at the same time. In the example illustrated in FIG. 2, the molar ratio of a group V precursor such as $NH_3$ to a group III precursor such as trimethyl aluminum starts at 56. Other suitable group III precursors include trimethyl gallium, triethyl aluminum, and triethyl gallium.

After the portion of the nucleation layer immediately adjacent to the substrate has finished growing, for example, after growth of the first 100 to 500 angstroms, the flow rate of the group V precursor is increased in stage 22 to a group V/group III molar ratio of 168. Typically the flow rate of the group III precursor remains constant during the entire growth of the nucleation layer and the group V precursor flow rate is adjusted to achieve the desired molar ratio, though the group V precursor flow rate can be held constant as the group III precursor flow rate is adjusted. The molar ratios given in FIG. 2 are just one example. In general, the group V precursor to group III precursor molar ratio during the first stage of growth may range from about 20 to about 100, and the group V precursor to group III precursor molar ratio during the second stage of growth may be greater than 150. The molar ratios may be adjusted in one or more discrete steps or continuously over time.

In stage 24, the group III precursor is changed or an additional group III precursor is added and growth of coalescence layer 14 begins. For example, if coalescence layer 14 is GaN, the flow of trimethyl aluminum is stopped and a gallium precursor such as trimethyl gallium is introduced into the reactor. If coalescence layer 14 is AlGaN, the flow rate of the aluminum precursor may be adjusted and a gallium precursor is introduced to the reactor. Coalescence layer 14 and the layers in n-type region 15 are usually grown at a molar ratio of about 1000, though the molar ratio can be as high as 2000.

Figure 3:
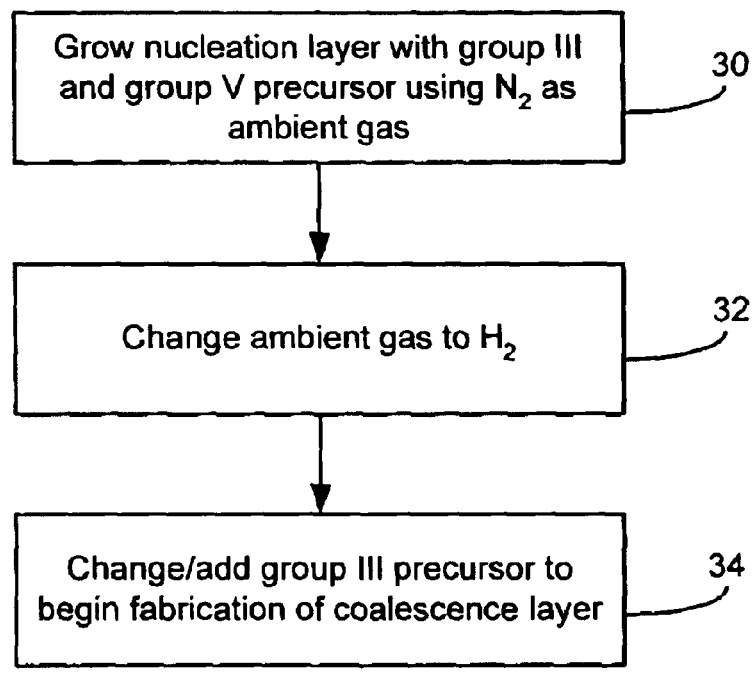
FIG. 3 illustrates an alternate method of forming nucleation layer 12 and coalescence layer 14 of FIG. 1.

In general, III-nitride layers are grown in a hydrogen ambient, because layers grown in a hydrogen ambient are observed to be smoother than layers grown in other ambients. In some embodiments of the present invention, nitrogen rather than hydrogen is used as ambient during growth of nucleation layer 12. FIG. 3 illustrates one such example of a method of forming nucleation layer 12 and coalescence layer 14. In stage 30, growth of nucleation layer 12 begins by introducing a group III precursor and a group V precursor into a reactor in a nitrogen ambient. After growth of nucleation layer 12 is complete, hydrogen is introduced in stage 32. The group III precursor is changed or another group III precursor is added in stage 34 in order to begin growth of coalescence layer 14. Stages 32 and 34 may occur simultaneously, or stage 32 may occur abruptly or gradually after growth of the coalescence layer has begun. The use of a nitrogen ambient during growth of nucleation layer 12 suppresses reaction between the group V precursor and the substrate. In some embodiments, the techniques illustrated in FIGS. 2 and 3 are used together to grow nucleation layer 12.

Figure 4:
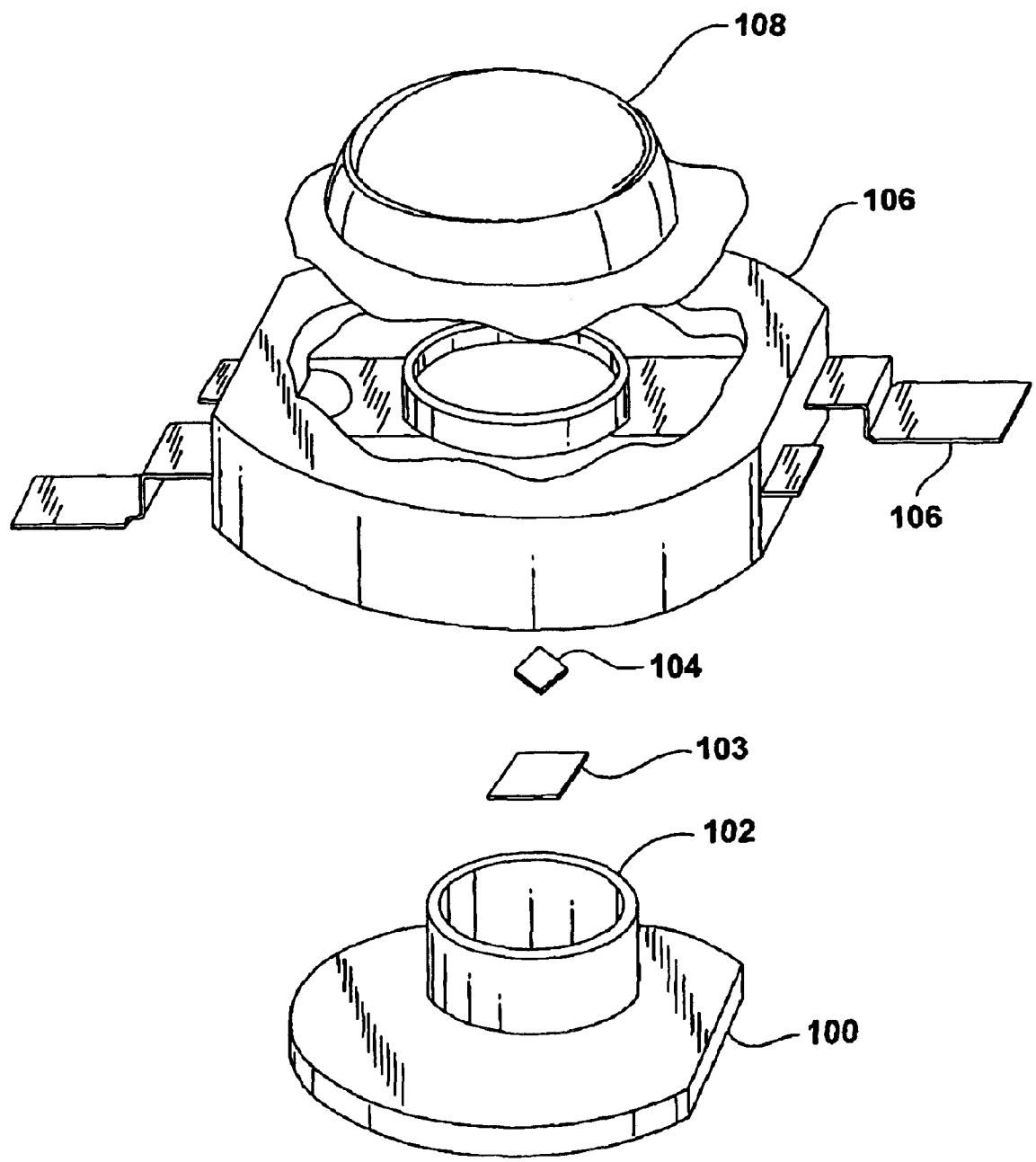
FIG. 4 illustrates a packaged light emitting device.

FIG. 4 is an exploded view of a packaged light emitting device. A heat-sinking slug 100 is placed into an insert-molded leadframe 106. The insert-molded leadframe 106 is, for example, a filled plastic material molded around a metal frame that provides an electrical path. Slug 100 may include an optional reflector cup 102. Alternatively, slug 100 may provide a pedestal without a reflector cup. The light emitting device die 104, which may be fabricated according to the methods described above, is mounted directly or indirectly via a thermally conducting submount 103 to slug 100. An optical lens 108 may be added.

Figure 5:
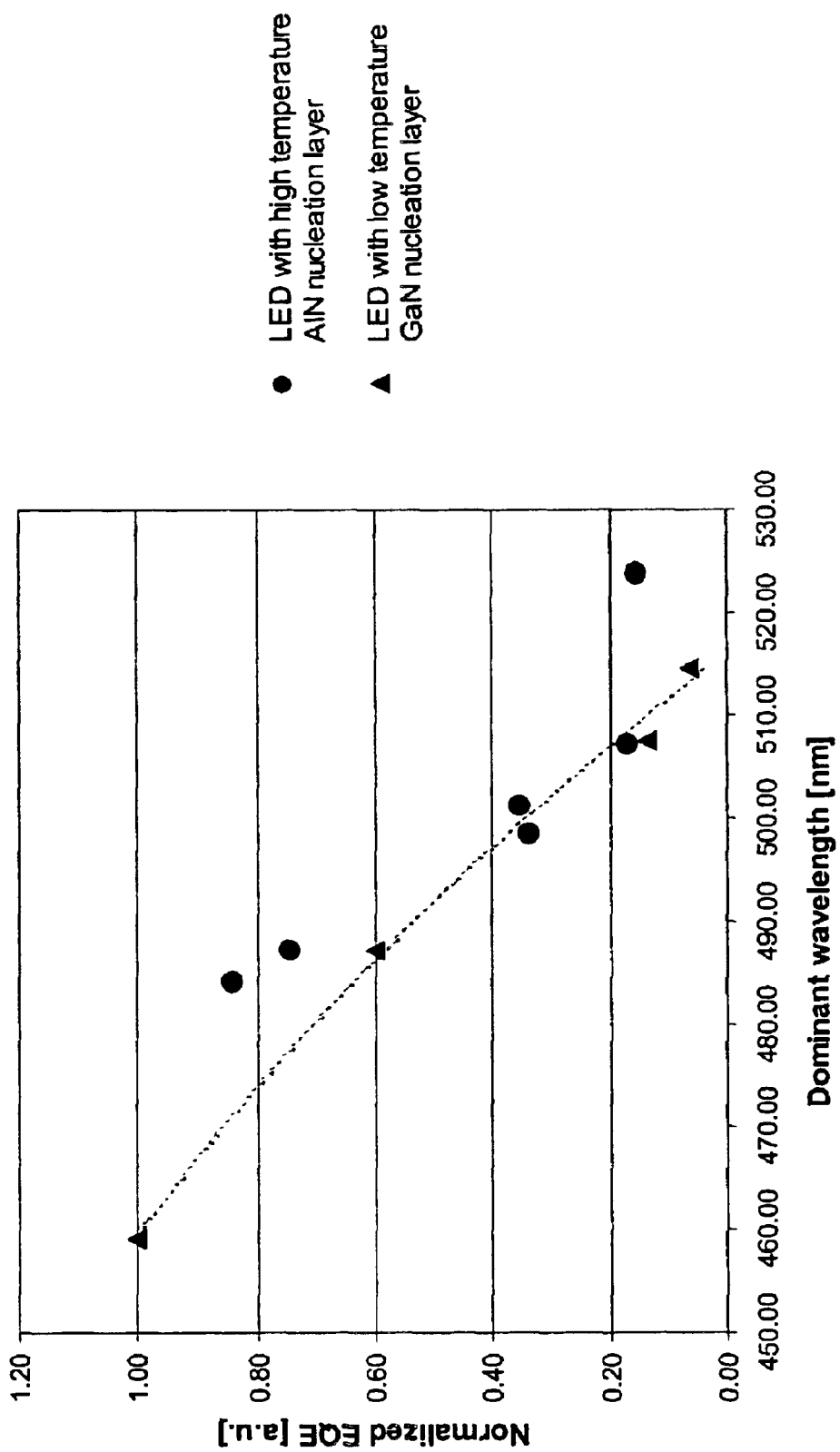
FIG. 5 is a plot of external quantum efficiency as a function of wavelength for devices including a low temperature nucleation layer and devices including a high temperature nucleation layer according to embodiments of the present invention.

The light output, surface smoothness, dislocation density, and strain in devices fabricated with the high temperature nucleation layer of FIG. 1 are observed to be comparable to devices with a low temperature nucleation layer where additional processes are implemented to reduce threading dislocations to a similar density. FIG. 5 is a plot of external quantum efficiency as a function of wavelength. As illustrated in FIG. 5, devices with a high temperature nucleation layer according to embodiments of the present invention have external quantum efficiencies comparable to such low temperature nucleation layer devices. Thus, the use of a high temperature nucleation layer according to FIG. 1 rather than a low temperature nucleation layer is advantageous because it results in a comparable device and requires a much simpler growth process. For example, the use of a high temperature nucleation layer eliminates the temperature cycling between cleaning, growth of the nucleation layer, and growth of the next layer, as well as the growth pause necessary to heat the reactor between growth of the low temperature nucleation layer, which is usually grown at a temperature less than 600° C., and growth of the layer overlying the nucleation layer, which is usually grown at a temperature greater than 1000° C. In addition, the use of a high temperature nucleation layer eliminates the additional semiconductor layers and additional processing necessary to create a suitably smooth surface in devices with a low temperature nucleation layer. Elimination of temperature cycling, growth pauses, extra semiconductor layers, and additional processing reduces the time and expense required to fabricate the device, and reduces the likelihood of contaminants collecting on the surfaces of the device and impairing yield or device performance. In addition, the use of a high temperature nucleation layer eliminates many of the uniformity problems caused by the narrow thickness and temperature regimes required by low temperature nucleation layers. The dislocation density of the devices shown in FIG. 5 is about $10^9$ $cm^{-2}$. In some embodiments, devices with high temperature nucleation layers according to embodiments of the present invention may be further processed to reduce dislocation densities.

Embodiments of the present invention also offer several advantages over the method described in U.S. Pat. No. 5,990,495 (hereinafter "Ohba"). First, the methods described herein do not require an anneal to create devices with sufficiently low strain to exhibit acceptable device performance. Second, nucleation layer 12 and coalescence layer 14 are grown at significantly lower temperature than Ohba's nucleation layer, reducing the time required to heat the substrate, the time required to cool the device to temperatures appropriate for forming the device layers, and the possibility of damage to the reactor.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A method of forming a light emitting device, the method comprising:

providing a sapphire substrate;

growing an $Al_{1-x}Ga_xN$ first layer by metal organic chemical vapor deposition directly on on the substrate at a temperature between about 1000° C. and about 1180° C., wherein $0 \leq x < 1$ and wherein the first layer has a thickness between about 500 angstroms and about 5000 angstroms, and wherein growing the first layer comprises: growing a first portion of the first layer adjacent to the substrate at a first ratio of group V precursor to a group III precursor; and Increasing the first ratio to a second ratio of a group V precursor to a group III precursor while growing a second portion of the first layer; and growing a III-nitride second layer overlying the first layer.

2. The method of claim 1 wherein the first layer is grown at a temperature between about 1060° C. and about 1160° C.

3. The method of claim 1 wherein the first layer is grown at a temperature between about 1080° C. and about 1100° C.

4. The method of claim 1 wherein the first layer is AlN.

5. The method of claim 1 wherein the first layer has a thickness between about 1000 angstroms and about 3000 angstroms.

6. The method of claim 1 wherein the first layer has a thickness between about 2000 angstroms and about 2500 angstroms.

7. The method of claim 1 wherein $0 \leq x \leq 0.5$.

8. The method of claim 1 wherein the second layer is grown at the same temperature as the first layer.

9. The method of claim 1 wherein the second layer is grown at a lower temperature than the first layer.

10. The method of claim 1 wherein the second layer is one of GaN, InGaN, AlGaN, and AlInGaN.

11. The method of claim 1 wherein the second layer is doped.

12. The method of claim 1 wherein the second layer is doped with Si to a dopant concentration ranging from undoped to about $5 \times 10^{18}$ $cm^{-3}$.

13. The method of claim 1 wherein the second layer is doped with a p-type dopant and has a dopant concentration ranging from undoped to about $5 \times 10^{19}$ $cm^{-3}$.

14. The method of claim 1 wherein the second layer has a thickness between about 500 angstroms and about 2 microns.

15. The method of claim 1 wherein the group V precursor comprises $NH_3$.

16. The method of claim 1 wherein the group III precursor comprises at least one of trimethyl aluminum, trimethyl gallium, triethyl aluminum, and triethyl gallium.

17. The method of claim 1 wherein the first ratio is a molar ratio ranging between about 20 and about 100, and the second ratio is a molar ration greater than about 150.

18. The method of claim 1 wherein growing a first portion of the first layer comprises growing between about 100 angstroms and about 500 angstroms of the first layer.

19. The method of claim 1 further comprising providing the group III precursor and the group V precursor to the substrate at substantially the same time.

20. The method of claim 1 wherein growing the first layer comprises providing a group III precursor, a group V precursor, and an ambient to the substrate, wherein the ambient is nitrogen.

21. The method of claim 20 further comprising providing hydrogen during growth of the second layer.

22. The method of claim 1 further comprising:

growing an n-type region overlying the second layer;

growing an active region overlying the n-type region; and growing a p-type region overlying the active region.

23. The method of claim 22 further comprising:

forming a first contact electrically connected to the n-type region;

forming a second contact electrically connected to the p-type region; and providing a lens overlying a side of the substrate opposite the first layer.

* * * * *

UNITED STATES PATENT AND TRADEMARK OFFICE
CERTIFICATE OF CORRECTION

PATENT NO. : 6,900,067 B2
DATED : May 31, 2005
INVENTOR(S) : Junko Kobayashi and Werner K. Goetz It is certified that error appears in the above-identified patent and that said Letters Patent is hereby corrected as shown below:

<u>Column 6,</u>
Line 64, cancel "on on" and substitute -- on --.

Signed and Sealed this

Eighteenth Day of October, 2005

JON W. DUDAS
*Director of the United States Patent and Trademark Office*